United States Patent
Donig et al.

[11] Patent Number: 5,524,037
[45] Date of Patent: Jun. 4, 1996

[54] CIRCUIT CONFIGURATION FOR GENERATING EVEN-NUMBERED DUTY FACTORS

[75] Inventors: Günter Donig, Poing; Edmund Goetz, Dachau; Helmut Herrmann, München, all of Germany

[73] Assignee: Siemens Aktiengesellschaft, Munich, Germany

[21] Appl. No.: 347,886

[22] Filed: Dec. 1, 1994

[30] Foreign Application Priority Data

Dec. 1, 1993 [DE] Germany ......................... 43 40 966.0

[51] Int. Cl.⁶ ................................................. H03K 23/66
[52] U.S. Cl. .............................. 377/108; 377/48; 377/104; 327/176
[58] Field of Search ..................... 377/47, 48, 108, 377/116, 104, 105, 34

[56] References Cited

U.S. PATENT DOCUMENTS

| | | | |
|---|---|---|---|
| 3,902,125 | 8/1975 | Oliva | 377/108 |
| 4,606,059 | 8/1986 | Oida | 377/108 |
| 4,703,495 | 10/1987 | Bereznak | 377/47 |
| 4,845,727 | 7/1989 | Murry | 377/104 |
| 5,077,764 | 12/1991 | Yamashita | 377/116 |

FOREIGN PATENT DOCUMENTS 283024   9/1990   Germany.

OTHER PUBLICATIONS

Publication: Electronic World+Wireless World, Aug. 1990, p. 685 (Mark Watson) "Divide–by three with 1:1 M/S ratio".

*Primary Examiner*—John S. Heyman
*Attorney, Agent, or Firm*—Herbert L. Lerner; Laurence A. Greenberg

[57] ABSTRACT

A circuit configuration generates an even-numbered duty factor with an odd-numbered division n of a symmetrical clock signal. A first device generates a first output signal from the symmetrical clock signal. The first output signal begins upon each $n^{th}$ edge of one type, of a symmetrical clock signal and remains active for a length of N–½ periods of the symmetrical clock signal. A second device generates a second output signal from the symmetrical clock signal. The second output signal begins upon each $n^{th}$ edge of another type, of the symmetrical clock signal and remains active for the length of N–½ periods of the symmetrical clock signal. A logic linkage is connected to the first and second devices for linking the two output signals to form one symmetrical output signal.

2 Claims, 1 Drawing Sheet

CIRCUIT CONFIGURATION FOR GENERATING EVEN-NUMBERED DUTY FACTORS

BACKGROUND OF THE INVENTION

Field of the Invention

The invention relates to a circuit configuration for generating even-numbered duty factors with an odd-numbered division n of a symmetrical clock signal.

In general, in many systems symmetrical clock pulses are required. An example thereof is low-harmonics clock generation in high-frequency systems in mixers, modulators, demodulators, etc. In division with an odd-numbered divisor factor n=3, 5, 7, 9, etc., typical divider circuits in general produce output clock pulses with an asymmetrical duty factor:

$$\text{Duty Factor } DF = \frac{t_L}{t_H} = \frac{1}{2}, \frac{2}{3}, \frac{3}{4}, \frac{4}{5}, \ldots$$

In general, the duty factor can be described by the following formula:

$$DF = \frac{N^2 + N}{N^2 - N}, \text{ where } N = 3, 5, 7, 9, \ldots$$

SUMMARY OF THE INVENTION

It is accordingly an object of the invention to provide an circuit configuration for generating even-numbered duty factors, which overcomes the hereinafore-mentioned disadvantages of the heretofore-known devices of this general type and which has an odd-numbered division of a symmetrical clock signal.

With the foregoing and other objects in view there is provided, in accordance with the invention, a circuit configuration for generating an even-numbered duty factor with an odd-numbered division n of a symmetrical clock signal, comprising first means for generating a first output signal from the symmetrical clock signal, the first output signal beginning upon each $n^{th}$ edge of one type, of a symmetrical clock signal and remaining active for a length of N–½ periods of the symmetrical clock signal; second means for generating a second output signal from the symmetrical clock signal, the second output signal beginning upon each $n^{th}$ edge of another type, of the symmetrical clock signal and remaining active for the length of N–½ periods of the symmetrical clock signal; and a logic linkage connected to the first and second means for linking the two output signals to form one symmetrical output signal.

In accordance with a concomitant feature of the invention, there are provided n+1 series-connected D latches including first, next-to-last and last D latches, each of the D latches having a clock input, a signal input, and an output for supplying an output signal, the clock input of every other D latch receiving the symmetrical clock signal and an inverted symmetrical clock signal in alternation; a NOR gate receiving the output signals of the last D latch and the next-to-last D latch, the NOR gate supplying an output signal to the signal input of the first D latch; and an output terminal also receiving the output signal of the NOR gate.

The principle of the present invention is to subtract one-half of a clock period from the generally longer "low" phase which lasts two clock periods, for instance, where division is by 3, and to add one-half of a clock period to the shorter "high" phase which lasts one clock period, for instance, where division is by 3.

To this end, the first means for generating the first output signal from the symmetrical clock signal are used. This output signal becomes active upon each $n^{th}$ edge of a first type, for instance the leading edge, of the symmetrical clock signal and remains active for the length of $$\frac{N-1}{2}$$

periods of the symmetrical clock signal. Two means are used to generate the second output signal from the symmetrical clock. This output signal becomes active with each $n^{th}$ edge of the other type, for instance the trailing edge, of the symmetrical clock signal, and once again remains active for the length of $$\frac{N-1}{2}$$

periods of the symmetrical clock signal.

A logic configuration then links the two output signals to make one symmetrical output signal. If the active state of the first and second output signals is each high, then the logic configuration can be an OR gate, or if the active state of the output signals is low it can be an AND gate.

Other features which are considered as characteristic for the invention are set forth in the appended claims.

Although the invention is illustrated and described herein as embodied in a circuit configuration for generating even-numbered duty factors, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
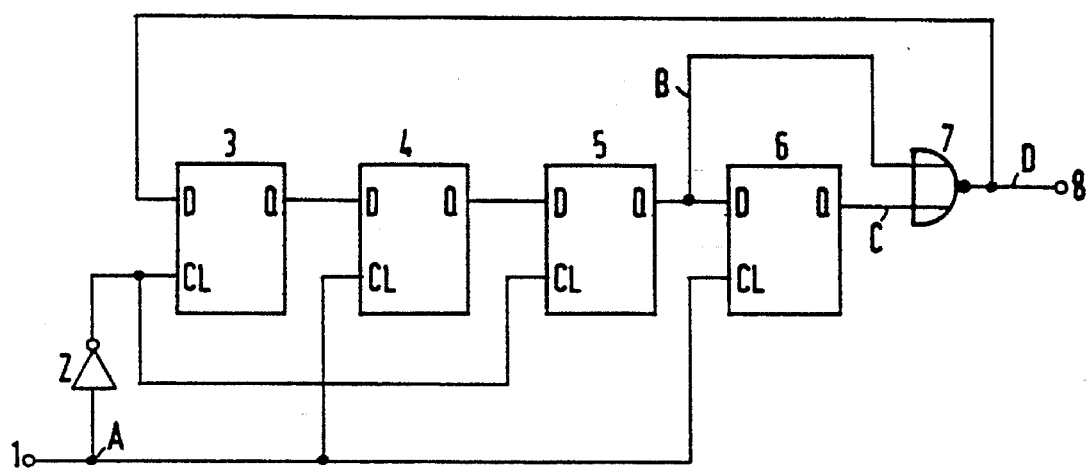
FIG. 1 is a block-circuit diagram of an exemplary embodiment of the configuration according to the invention.

Referring now to the figures of the drawing in detail and first, particularly, to FIG. 1 thereof, there is seen an embodiment of a symmetrical divider-by-three according to the invention. Reference numeral 1 indicates an input terminal, to which a symmetrical clock signal can be supplied. This input terminal 1 is directly connected to a clock input CL of both a D latch 4 and a D latch 6. The input terminal 1 is also connected through an inverter 2 to clock inputs CL of further D latches 3 and 5. An output Q of the D latch 3 is connected to an input D of the D latch 4. An output Q of the D latch 4 is also connected to an input D of the D latch 5, and an output Q of the D latch 5 is connected to an input D of the D latch 6. The output Q of the D latch 5 is also connected to a first input of a NOR gate 7. A second input of the NOR gate 7 is connected to an output Q of the D latch 6. An output of the NOR gate 7 is connected both to an input D of the D latch 3 and to another output terminal 8. The letters A, B, C and D designate circuit points at which signal courses shown in FIG. 2 can be picked up.

Each two of the individual D latches included in FIG. 1 form a master-slave flip-flop. A delay of one-half clock period can be generated by a pickup or tap between the master and slave, that is between the D latches 5, 6. At the same time, the circuit shown in FIG. 1 has the advantage of being able to be automatically synchronized to a fixed internal clock ratio $T_H=1\,T$ and $TL=2\,T$, and thus a NOR linkage can be used.

Figure 2:
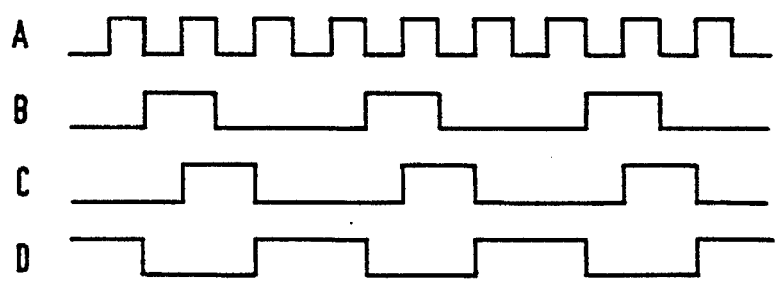
FIG. 2 is a timing diagram of various signals of the circuit shown in FIG. 1.

As can be seen from FIG. 2, an output signal is generated at the output of the D latch 5 which is connected to the circuit point B. The output signal is activated upon the trailing edge of the symmetrical clock signal which is applied to the input terminal 1 connected to the circuit point A. The output signal remains active for the length of one clock period. The signal is generated at an interval of three clock periods. At the output of the D latch 6, which is connected to the circuit point C, the output signal that is generated is offset by one-half of a clock period relative to the signal at the circuit point B. Through the use of the NOR linkage 7, a symmetrical output signal is generated at the circuit point or node D. This signal can be picked up at the output 8.

We claim:

1. A circuit configuration for generating an even-numbered duty factor with a division factor n of a symmetrical clock signal, where n is an odd-numbered integer, comprising:

first means for generating a first output signal from the symmetrical clock signal, the first output signal beginning upon each $n^{th}$ edge of one type, of a symmetrical clock signal and remaining active for a length of $$\left[\frac{N-1}{2}\right] \quad \frac{1}{2}(n-1)$$

periods of the symmetrical clock signal;

second means for generating a second output signal from the symmetrical clock signal, the second output signal beginning upon each $n^{th}$ edge of another type, of the symmetrical clock signal and remaining active for the length of $$\left[\frac{N-1}{2}\right] \quad \frac{1}{2}(n-1)$$

periods of the symmetrical clock signal;

a logic linkage connected to said first and second means for linking the two output signals to form one symmetrical output signal;

n+1 series-connected D latches including first next-to-last and last D latches, each of said D latches having a clock input, a signal input, and an output for supplying an output signal, the clock input of every other D latch receiving the symmetrical clock signal and an inverted symmetrical clock signal in alternation;

a NOR gate receiving the output signals of said last D latch and said next-to-last D latch said NOR gate supplying an output signal to the signal input of said first D latch; and an output terminal also receiving the output signal of said NOR gate.

2. A circuit configuration for generating an even-numbered duty factor with an odd-numbered, integer division factor n of a symmetrical clock signal, comprising:

n+1 series-connected D latches including first, next-to-last and last D latches, where n is an odd-numbered integer, each of said D latches having a clock input, a signal input, and an output supplying an output signal, said D latches being alternatingly clocked with the symmetrical clock signal and an inverted symmetrical clock signal, respectively, such that said first and said next-to-last D latches are clocked with the symmetrical clock signal and said last D latch is clocked with the inverted symmetrical clock signal;

a NOR gate receiving the output signals of said last D latch and said next-to-last D latch;

said NOR gate supplying a NOR gate output signal to the signal input of said first D latch; and an output terminal receiving the NOR gate output signal with an even duty factor.

* * * * *